US012534283B2

(12) United States Patent
Lim et al.

(10) Patent No.: US 12,534,283 B2
(45) Date of Patent: Jan. 27, 2026

(54) DISPLAY DEVICE AND METHOD FOR ASSEMBLING SAME

(71) Applicant: SAMSUNG ELECTRONICS CO., LTD., Suwon-si (KR)

(72) Inventors: Bongsup Lim, Suwon-si (KR); Seokbong Baek, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 306 days.

(21) Appl. No.: 18/210,981

(22) Filed: Jun. 16, 2023

(65) Prior Publication Data

US 2023/0331455 A1 Oct. 19, 2023

Related U.S. Application Data

(63) Continuation of application No. PCT/KR2021/003485, filed on Mar. 22, 2021.

(30) Foreign Application Priority Data

Feb. 1, 2021 (KR) ........................ 10-2021-0014050

(51) Int. Cl.
*B65D 81/05* (2006.01)
*B65D 81/02* (2006.01)
(Continued)

(52) U.S. Cl.
CPC ........... *B65D 81/058* (2013.01); *B65D 65/44* (2013.01); *B65D 85/30* (2013.01); *C08F 112/08* (2013.01);
(Continued)

(58) Field of Classification Search
None
See application file for complete search history.

(56) References Cited

U.S. PATENT DOCUMENTS 7,588,148 B2 * 9/2009 Yang ...................... B65D 5/509 206/592
7,591,443 B2 9/2009 Lee et al.
(Continued)

FOREIGN PATENT DOCUMENTS

JP 2005-231655 9/2005
JP 2006-151499 6/2006
(Continued)

OTHER PUBLICATIONS

International Search Report, PCT/ISA/210, dated Oct. 22, 2021, in corresponding International Patent Application No. PCT/KR2021/003485.

(Continued)

*Primary Examiner* — Allen L Parker
*Assistant Examiner* — Christopher L Augustin
(74) *Attorney, Agent, or Firm* — STAAS & HALSEY LLP

(57) ABSTRACT

A display apparatus comprises a display including a stand mounting portion; a protective member coupleable to and decoupleable from the display along an edge of the display so that while the protective member is coupled to the display, the protective member covers at least the edge of the display; and a stand mountable to the stand mounting portion of the display along a front and rear direction of the display, the protective member includes a mounting portion protective member coupleable to and decoupleable from at least a portion of the display; a support protective member coupleable to and decoupleable from a portion of a lower end of the display; and a fall prevention protective member coupleable to and decoupleable from a side end of the display and coupleable to and decoupleable from a side end of the support protective member.

15 Claims, 10 Drawing Sheets

(51) Int. Cl.

| | |
|---|---|
| ***B65D 85/30*** | (2006.01) |
| ***C08F 112/08*** | (2006.01) |
| ***H05K 5/02*** | (2006.01) |

(52) U.S. Cl.

CPC ..... *H05K 5/0234* (2013.01); *B65D 2581/055* (2013.01)

(56) References Cited

U.S. PATENT DOCUMENTS

| | | | | |
|---|---|---|---|---|
| 8,777,009 | B2 | 7/2014 | Nakase | |
| 8,978,891 | B2 * | 3/2015 | Mitsuhashi .......... | B65D 81/057 206/453 |
| 2011/0149490 | A1 * | 6/2011 | Seo ...................... | B65D 81/058 361/679.01 |
| 2013/0100359 | A1 * | 4/2013 | Yokawa ............... | B65D 5/5069 206/320 |
| 2016/0368691 | A1 * | 12/2016 | Meng ................... | B65D 81/113 |

FOREIGN PATENT DOCUMENTS

| | | | | |
|---|---|---|---|---|
| JP | 2006-160335 | | | 6/2006 |
| JP | 5240879 | | | 7/2013 |
| JP | 2013-184711 | | | 9/2013 |
| JP | 2014-019484 | | | 2/2014 |
| JP | 2014019484 | A | * | 2/2014 |
| JP | 5942274 | | | 6/2016 |
| JP | 6324158 | | | 5/2018 |
| JP | 2018-131267 | | | 8/2018 |
| KR | 10-2007-0051162 | | | 5/2007 |
| KR | 10-2009-0104598 | | | 10/2009 |

OTHER PUBLICATIONS

Written Opinion, PCT/ISA/237, dated Oct. 22, 2021, in corresponding International Patent Application No. PCT/KR2021/003485.

* cited by examiner

DISPLAY DEVICE AND METHOD FOR ASSEMBLING SAME

CROSS-REFERENCE TO RELATED APPLICATION

This application is a continuation application, under 35 U.S.C. § 111 (a), of international application No. PCT/KR2021/003485, filed on Mar. 22, 2021, which claims priority under 35 U. S. C. § 119 to Korean Patent Application No. 10-2021-0014050, filed Feb. 1, 2021, the disclosures of which are incorporated herein by reference in their entireties.

BACKGROUND

Field

The present disclosure relates to a display apparatus and a method for assembling the same, and more particularly, to a display apparatus including a stand and a method for assembling the same.

Description of Related Art

As for a display apparatus, a display for displaying content has been higher resolution and larger size. A thickness of the display is getting thinner and a weight is getting lighter. The display apparatus may be classified into a wall-mounted type display apparatus that is fixed to a wall and a stand-type display apparatus that is used by standing on the floor.

The stand-type display apparatus may include a stand supporting the display so that the display stands on the floor. In general, the stand is mounted on a lower end of the display and may include a portion extending along the front and rear direction of the display.

Conventionally, when the stand is mounted on the display, the display is laid down to face the floor, and then the stand is mounted. Thereafter, the display to which the stand is mounted is moved to a position desired by a user.

SUMMARY

One aspect of the present disclosure provides a display apparatus comprising a display including a stand mounting portion, a protective member coupleable to and decoupleable from the display along an edge of the display so that while the protective member is coupled to the display, the protective member covers at least the edge of the display, and a stand mountable to the stand mounting portion of the display along a front and rear direction of the display, the protective member includes a mounting portion protective member coupleable to and decoupleable to at least a portion of the stand mounting portion of the display, a support protective member coupleable to and decoupleable to a portion of a lower end of the display, and a fall prevention protective member coupleable to and decoupleable from a side end of the display and coupleable to and decoupleable from a side end of the support protective member.

The fall prevention protective member may include a protective member coupler couplable to the side end of the support protective member.

The fall prevention protective member may include a display coupler, which is formed on a surface of the fall prevention protective member that is separate from a surface of the fall prevention protective member on which the protective member coupler is formed, so that the display coupler is couplable to a side end of the display.

The support protective member may include a support coupler formed to be coupled to the protective member coupler.

While the fall prevention protective member is coupled to the side end of the support protective member, a length of the fall prevention protective member along the front and rear direction of the display may be greater than a length of the support protective member along the front and rear direction of the display.

While the fall prevention protective member is coupled to the side end of the display, a length of the fall prevention protective member along the front and rear direction of the display may be same as a length of the support protective member along the front and rear direction of the display.

The support protective member may be disposed on both sides of the mounting portion protective member.

The protective member may be configured to accommodate the stand.

The protective member may include a cover protective member coupleable to an upper end of the display, the stand may include a first part e accommodatable in the support protective member of the protective member, and a second part accommodatable in the cover protective member of the protective member.

The first part of the stand may be provided to be separable from the support protective member while the fall prevention protective member is decoupled from the display. The protective member may be provided with expandable polystyrene.

Another aspect of the present disclosure provides a method of assembling a display apparatus including decoupling a fall prevention protective member that is coupleable to and decoupleable from a display of the display apparatus so that while the fall prevention protective member is coupled to the display, the fall prevention protective member covers at least an edge of display, coupling the fall prevention protective member to a support protective member provided to support a lower end of the display, decoupling a mounting portion protective member from the display to expose a portion of the display to which a stand is to be coupled, and mounting the stand to the display.

A cover protective member is provided that is coupleable to an upper end of the display and the method of assembling the display apparatus may further include decoupling at least one part of the stand which is accommodated in the support protective member or the cover protective member before mounting the stand to the display.

The method of assembling the display apparatus may further include decoupling at least one part of the stand which is accommodated in the support protective member after decoupling the fall prevention protective member from the display.

The method of assembling the display apparatus may further include decoupling the display from the support protective member after mounting the stand to the display.

The method of assembling the display apparatus may further include decoupling the cover protective member from the display before separating the display from the support protective member of the protective member.

The stand may include a first part accommodatable in the support protective member, and a second part accommodatable in the cover protective member of the protective member.

The method of assembling the display apparatus may further include providing the stand by coupling the first part to the second part after coupling the fall prevention protective member to the support protective member.

The fall prevention protective member may include a display coupler, which is formed to be coupled to a side end of the display, and a protective member coupler formed to be decoupled from the display coupler, the support protective member may include a support coupler formed to correspond to the protective member coupler so as to be coupled to the protective member coupler.

The protective member may be provided with expandable polystyrene.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
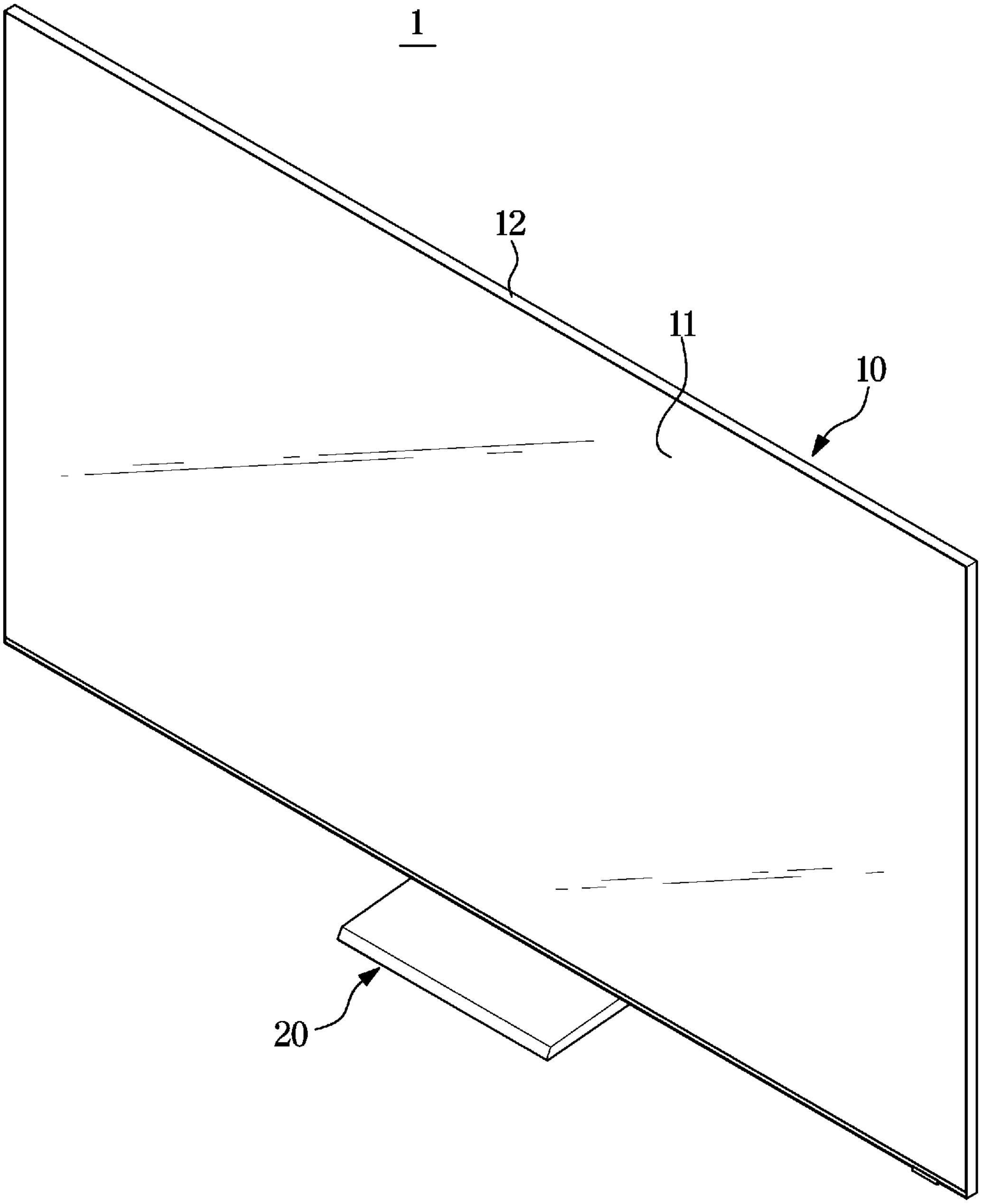
FIG. 1 is a view illustrating a display apparatus according to an embodiment of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

"Content" may be displayed on a display apparatus. For example, the "content" may include a video file or audio file played in a video player that is one of applications, a music file played in a music player, a photo file displayed in a photo gallery, a web page file displayed in a web browser, and the like. Also, the "content" may include broadcasting that is received.

The "content" may include a video file, an audio file, a text file, an image file, or a web page displayed or executed in an application. Also, the "content" may include a video file and/or an audio file included in a received broadcast signal.

The "content" may include an application screen to be executed and a user interface constituting the application screen. Also, the "content" may include one content or a plurality of content.

"Application" refers to software that is executed in a desktop operating system (OS), a mobile OS, or a display apparatus OS and is used by a user. For example, the "application" may include word processor, spreadsheet, contacts application, calendar application, memo application, alarm application, Social Network System (SNS) application, chatting application, map application, music player or video player. An application according to one embodiment of the present disclosure may refer to software executable on a display apparatus in response to a received user input. Further, an application according to one embodiment of the present disclosure may refer to software that is downloaded from the outside of a display apparatus and executable on the display apparatus.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "upper portion", "lower portion", "front and rear direction" and the like may be defined by the drawings, but the shape and the location of the component is not limited by the term.

The present disclosure is directed to providing a method for assembling a display apparatus capable of preventing damage to a display by reducing an external force applied to the display when a stand is mounted on the display.

Further, the present disclosure is directed to providing a display apparatus capable of preventing a display from falling when a stand is mounted on the display.

A method for assembling a display apparatus may enable assembling a stand while a display is upright. Accordingly, it is possible to prevent damage to the display by reducing an external force applied to the display when the stand is mounted on the display.

When a stand is mounted on a display, a display apparatus may have expanded width along a front and rear direction where a fall prevention protective member is coupled to a support protective member. Accordingly, it is possible to prevent the fall of the display.

Hereinafter exemplary embodiments of the present disclosure will be described in detail with reference to the accompanying drawings.

Figure 2:
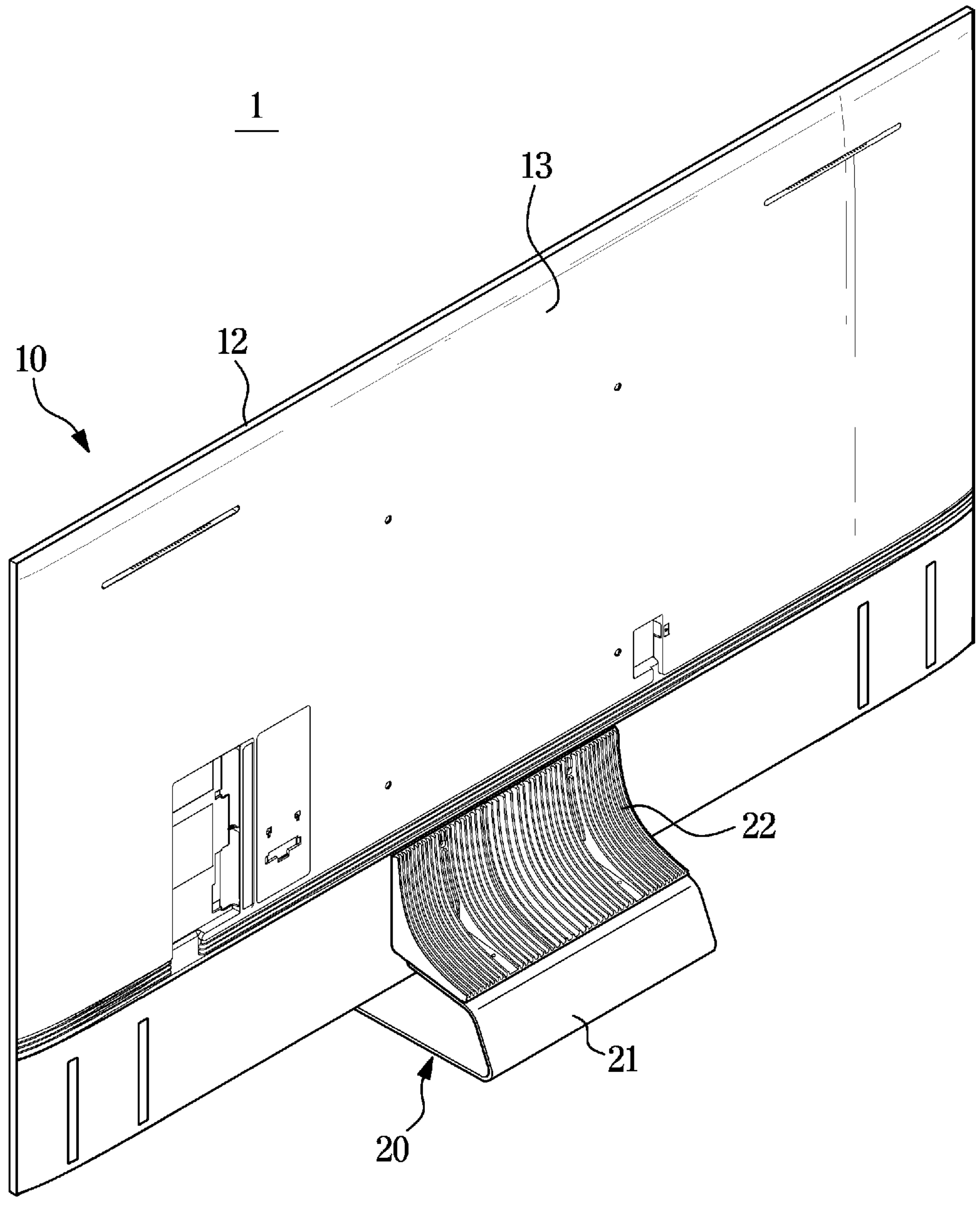
FIG. 2 is a view illustrating a rear side of the display apparatus shown in FIG. 1 according to an embodiment of the present disclosure.

FIG. 1 is a view illustrating a display apparatus according to one embodiment of the present disclosure. FIG. 2 is a view illustrating a rear side of the display apparatus shown in FIG. 1.

Referring to FIGS. 1 and 2, a display apparatus 1 may include a display 10 provided to display a content and a stand 20 provided to support the display 10. It will be easily understood by those skilled in the art that components included in the display 10 may be changed in response to slimming of the display 10.

The display 10 may include a display panel 11 on which the content is displayed, and may include a side frame 12 supporting at least a portion of a side portion of the display panel 11. The display 10 may be one of output devices that output a content visually and/or audibly, and the display panel 11 may include a liquid crystal panel, a light emitting diode (LED) panel, or a glass LED panel.

The stand 20 may be detachably coupled to a lower end of the display 10. The stand 20 may support the display 10 to allow the display 10 to stand on a floor. That is, the stand 20 may support the display 10 to prevent the display 10 from falling when the display 10 is placed on the floor.

The stand 20 may include a first part 21 in contact with the floor and a second part 22 fixed to the display 10. The first part 21 may have a substantially U-shape. One surface of the second part 22 may be coupled to the first part 21 and the other surface thereof may be coupled to the display 10.

The display apparatus 1 may include a rear cover 13 covering a rear surface.

Figure 3:
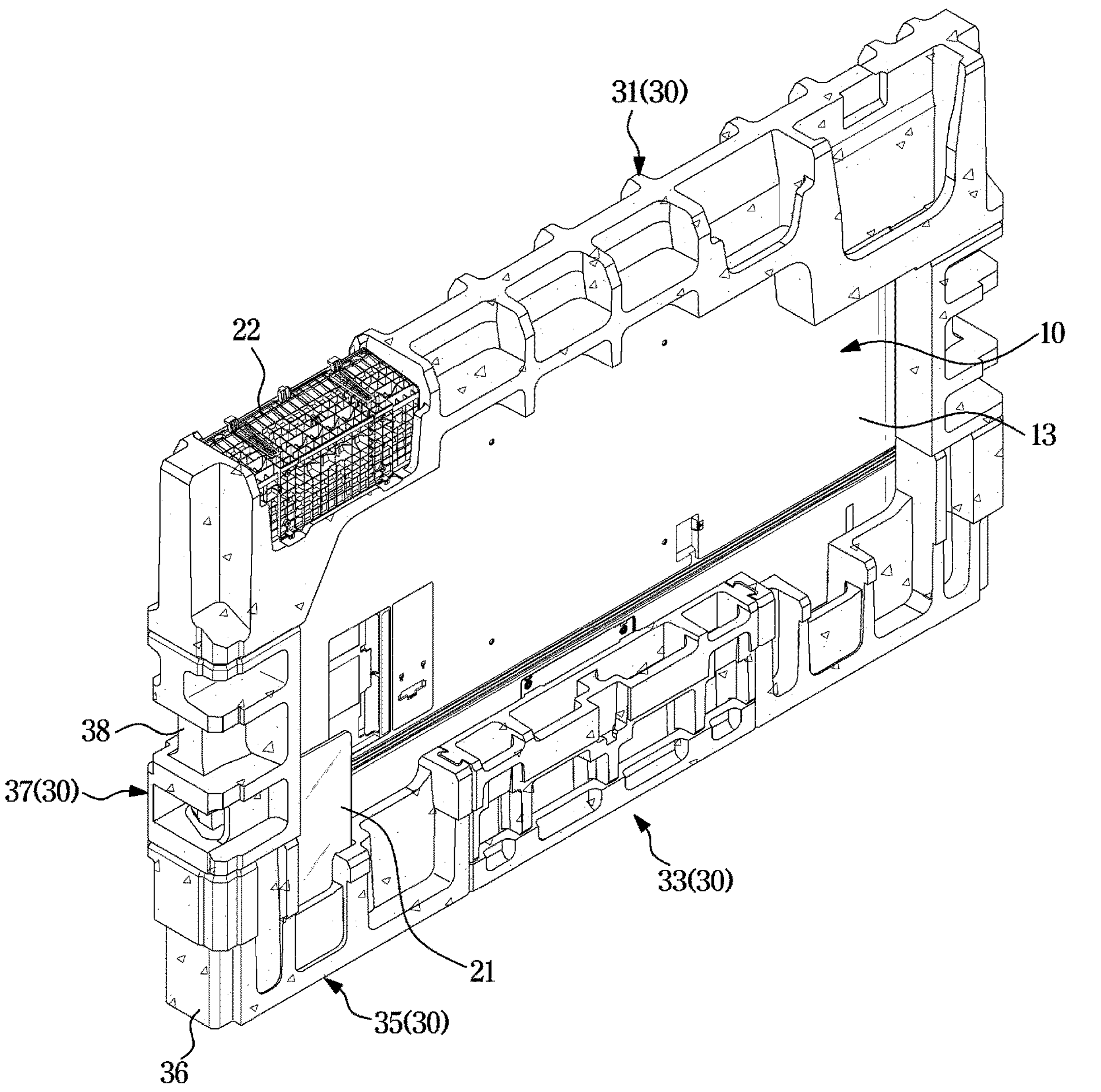
FIG. 3 is a view illustrating a state in which a display and a stand according to an embodiment of the present disclosure are covered by a protective member for storage and delivery.
Figure 4:
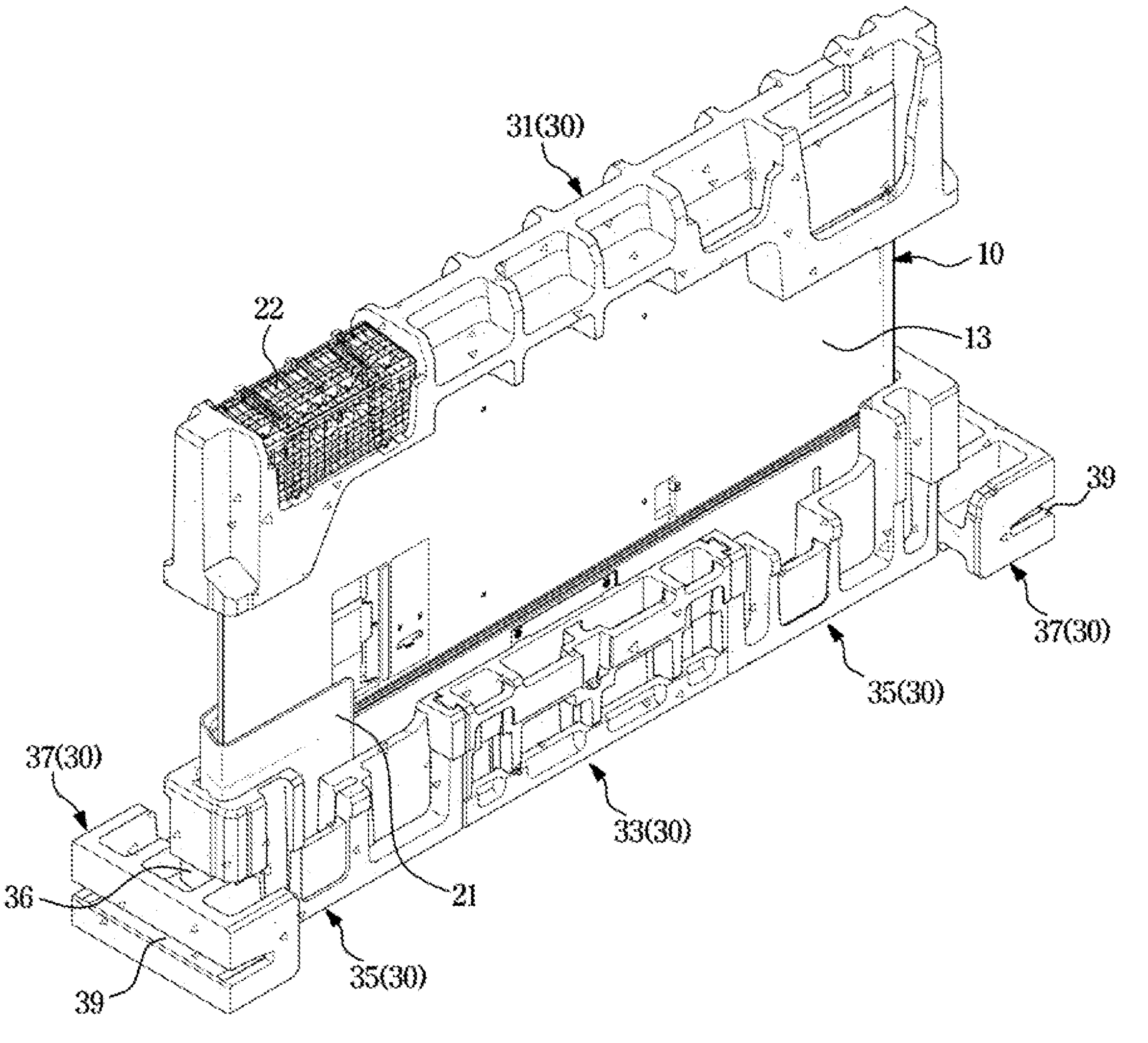
FIG. 4 is a view illustrating a state in which a fall prevention protective member shown in FIG. 3 is separated from the display and then coupled to a support protective member according to an embodiment of the present disclosure.
Figure 5:
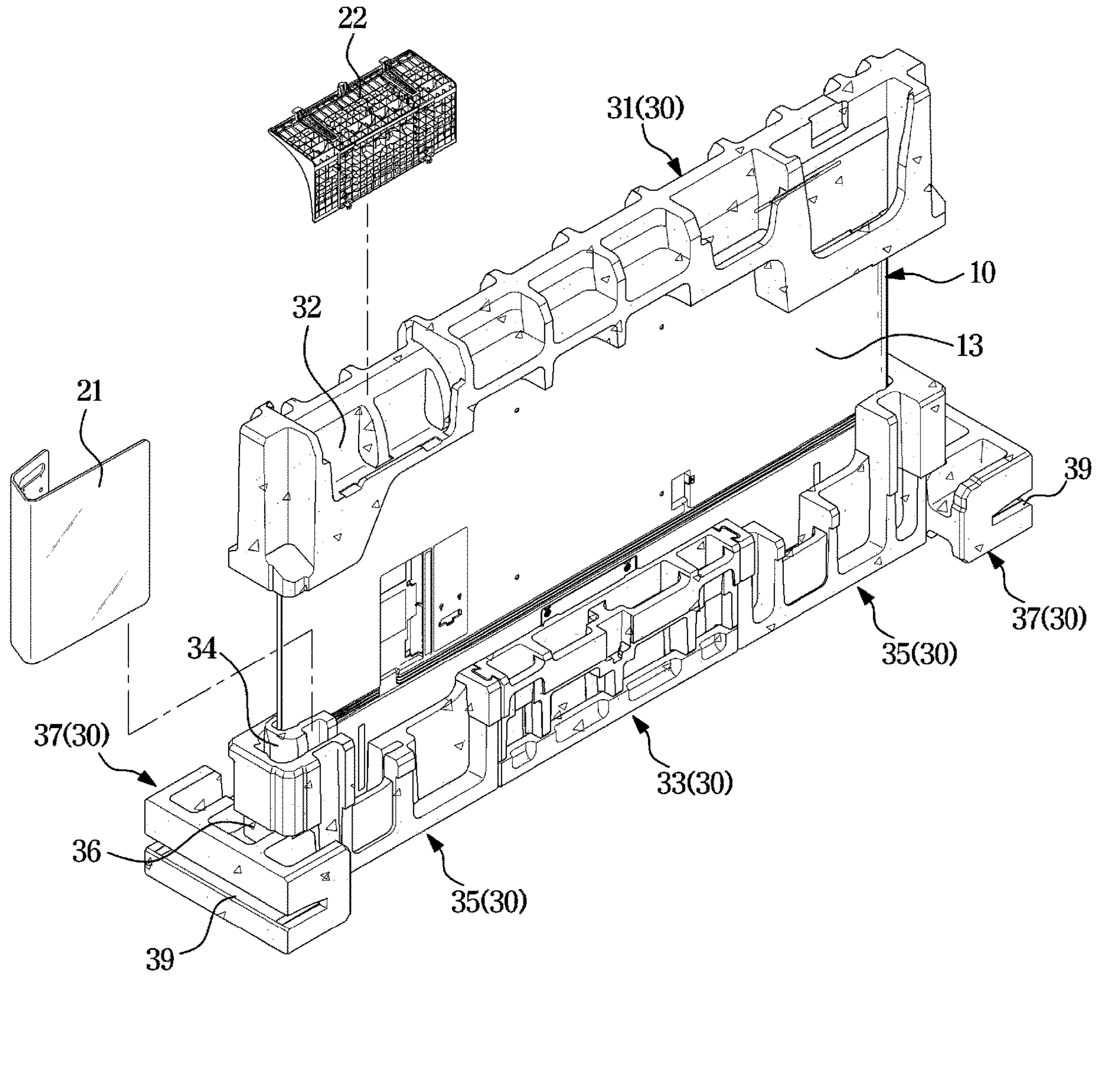
FIG. 5 is a view illustrating a state in which a cover protective member and the stand are separated from the display apparatus shown in FIG. 4 according to an embodiment of the present disclosure.
Figure 6:
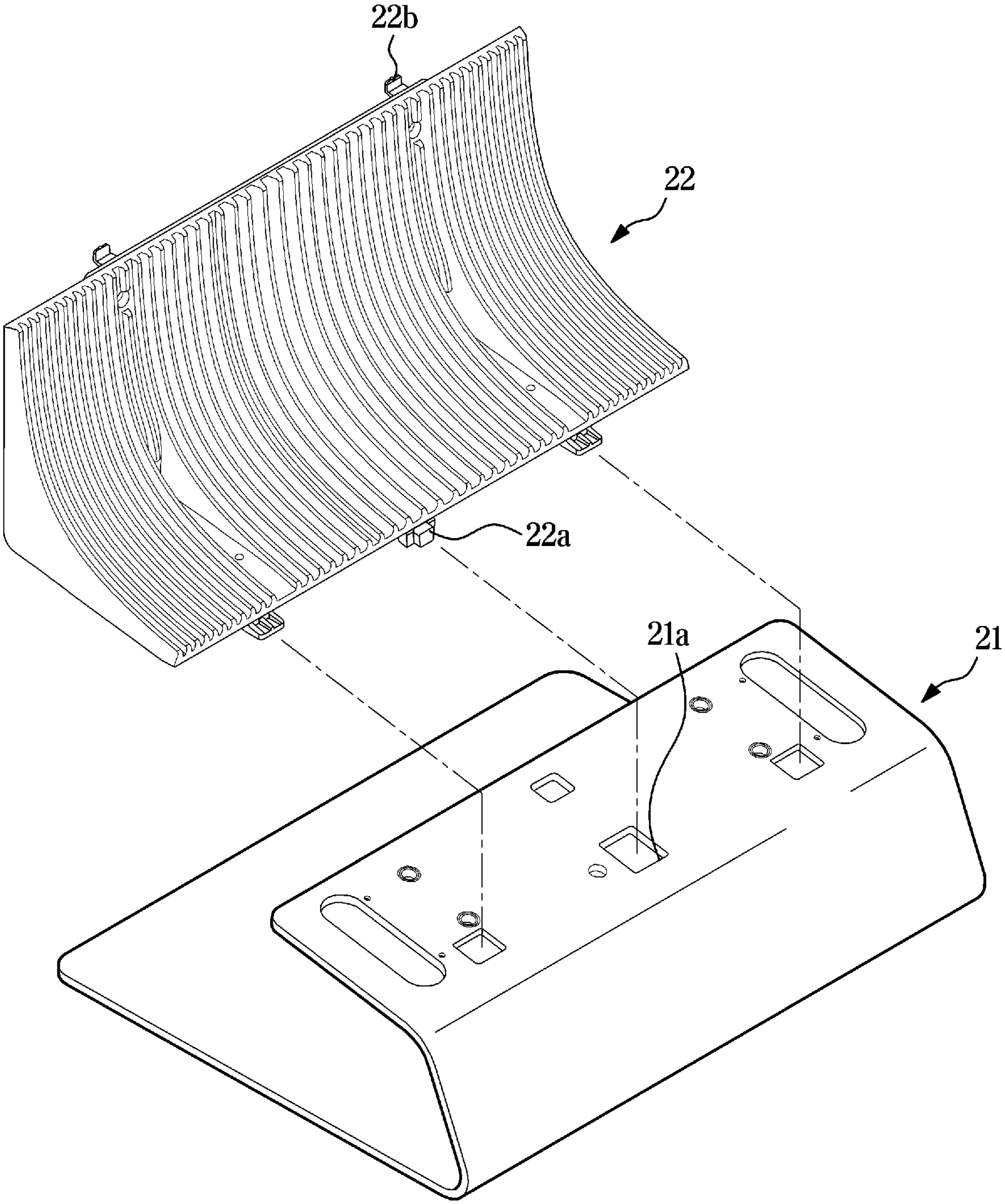
FIG. 6 is a view illustrating a state of assembling a first part and a second part of the stand shown in FIG. 5 according to an embodiment of the present disclosure.
Figure 7:
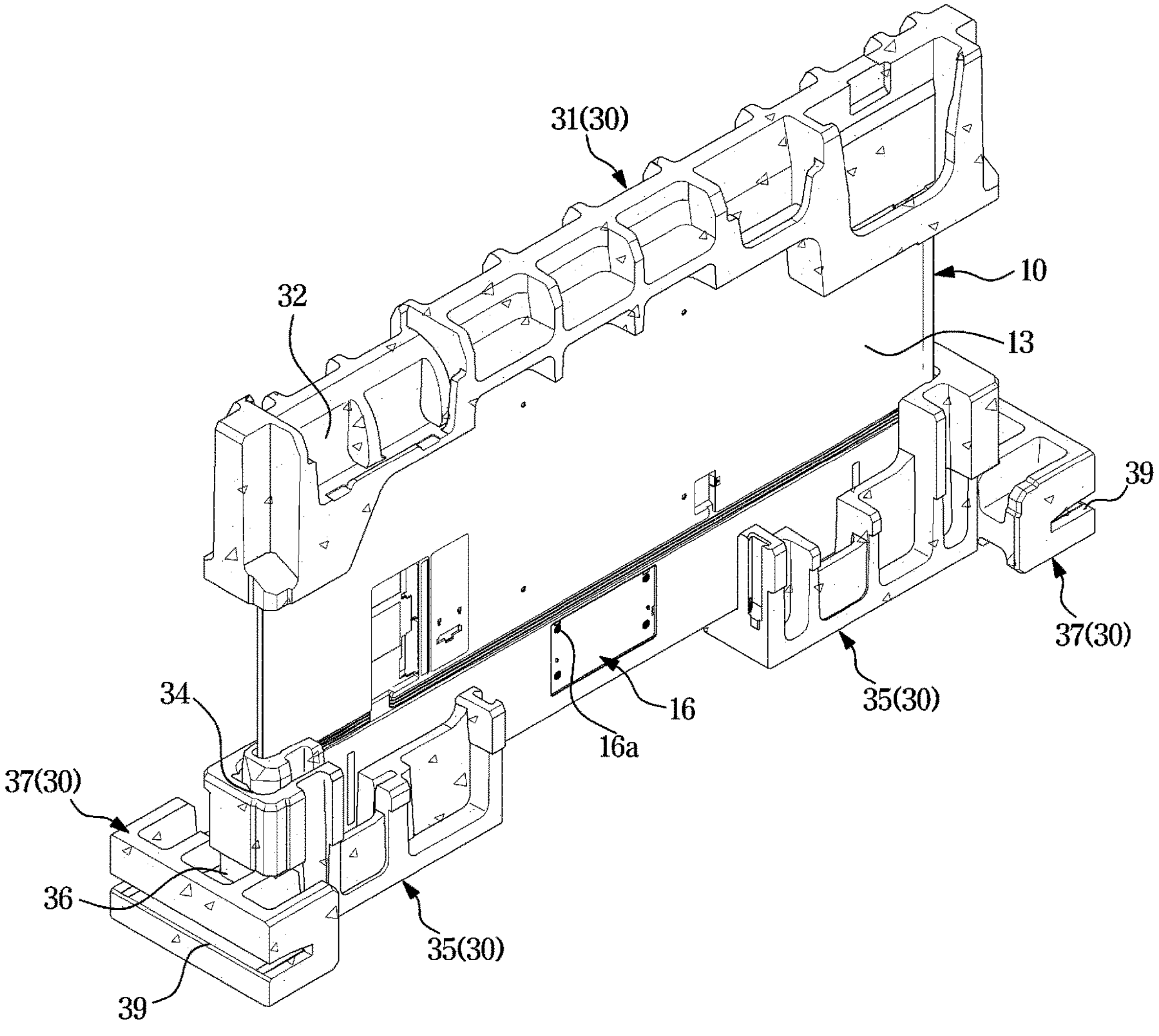
FIG. 7 is a view illustrating a state in which a mounting portion protective member is separated from the display apparatus shown in FIG. 6 according to an embodiment of the present disclosure.
Figure 8:
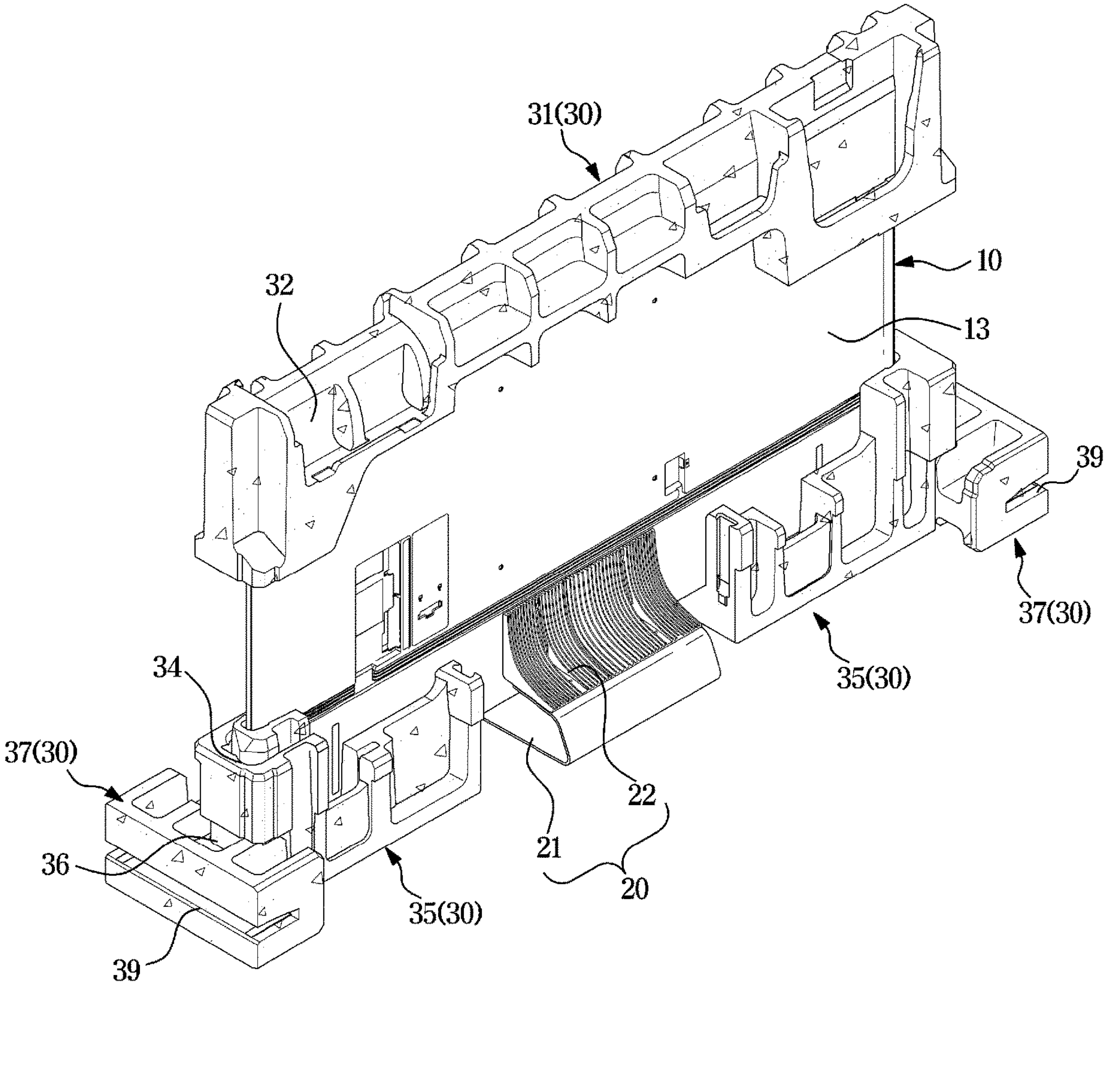
FIG. 8 is a cross-sectional view illustrating a process of coupling the stand, which is assembled in FIG. 6, to the display according to an embodiment of the present disclosure.
Figure 9:
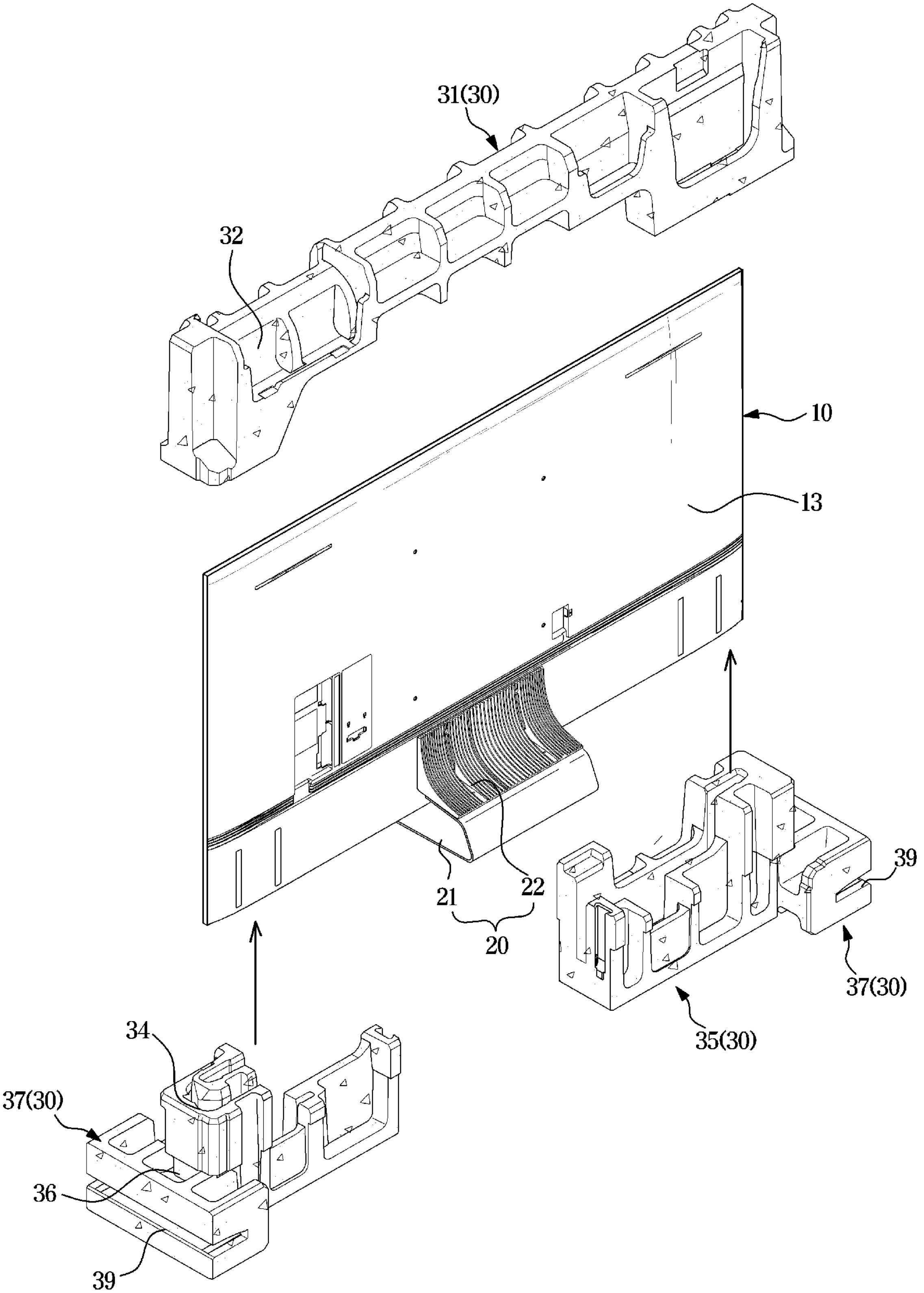
FIG. 9 is a view illustrating a state in which the support protective member is separated from the display to which the stand shown in FIG. 8 is coupled according to an embodiment of the present disclosure.
Figure 10:
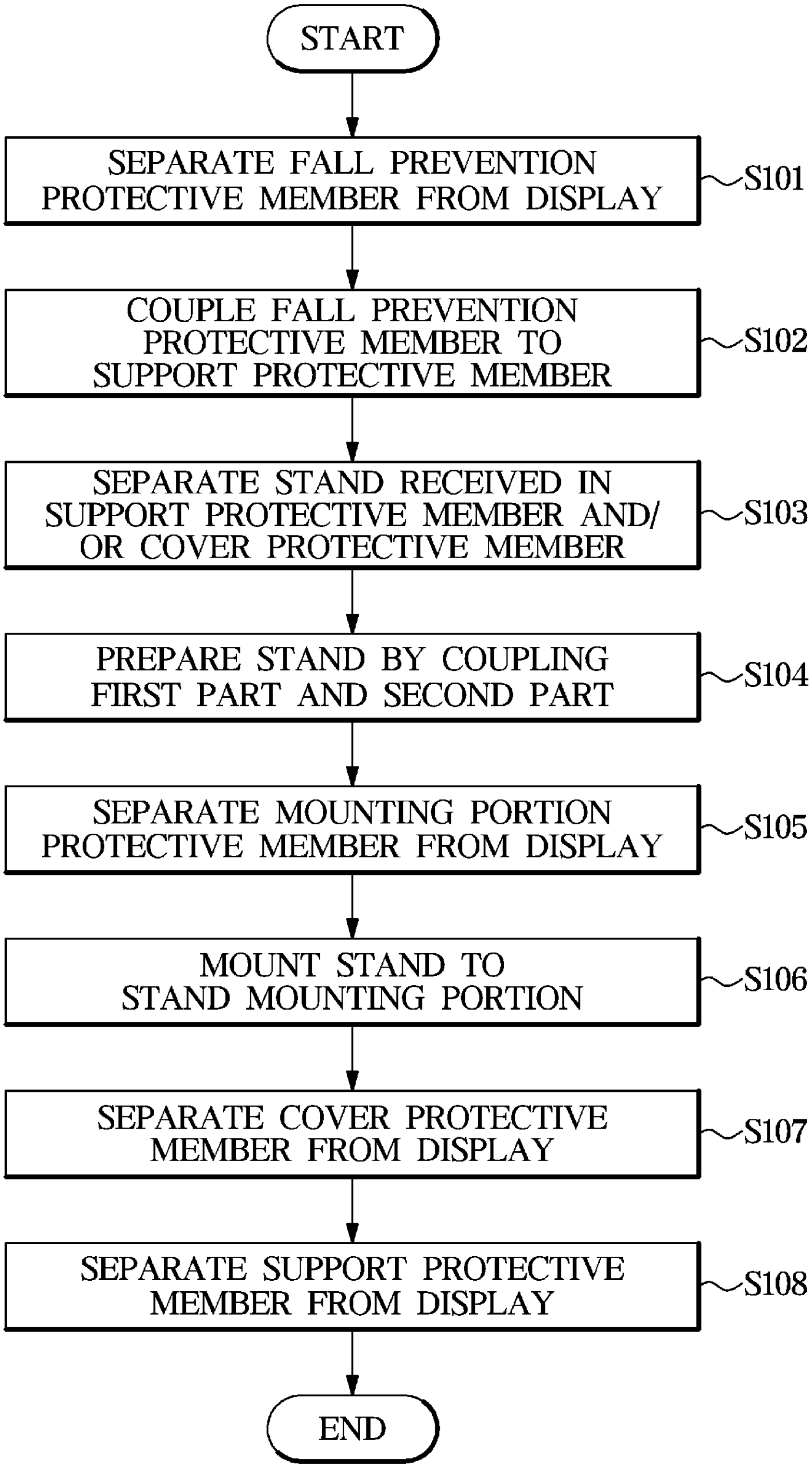
FIG. 10 is a flowchart sequentially illustrating a process of assembling the stand of the display apparatus according to an embodiment of the present disclosure.

FIG. 3 is a view illustrating a state in which a display and a stand according to one embodiment of the present disclosure are covered by a protective member for storage and delivery. FIG. 4 is a view illustrating a state in which a fall prevention protective member shown in FIG. 3 is separated from the display and then coupled to a support protective member. FIG. 5 is a view illustrating a state in which a cover protective member and the stand are separated from the display apparatus shown in FIG. 4. FIG. 6 is a view illustrating a state of assembling a first part and a second part of the stand shown in FIG. 5. FIG. 7 is a view illustrating a state in which a mounting portion protective member is separated from the display apparatus shown in FIG. 6. FIG. 8 is a cross-sectional view illustrating a process of coupling the stand, which is assembled in FIG. 6, to the display. FIG. 9 is a view illustrating a state in which the support protective member is separated from the display to which the stand shown in FIG. 8 is coupled. FIG. 10 is a flowchart sequentially illustrating a process of assembling the stand of the display apparatus according to an embodiment of the present disclosure.

Referring to FIG. 3, the display apparatus 1 may further include a protective member 30 for storage and delivery. Particularly, the display apparatus 1 may further include the protective member 30 for protecting the display 10 during storage and delivery. In the disclosure, the display apparatus 1 may be used to refer to only the display 10 and the stand 20, and may be used to refer to the protective member 30 as well as the display 10 and the stand 20.

The protective member 30 may be provided to cover at least a portion of the display 10. The protective member 30 may be detachably coupled along an edge of the display 10. The protective member 30 may include a shock absorber to mitigate an impact applied to the display 10. The protective member 30 may be formed of expandable polystyrene.

The protective member 30 may include a cover protective member 31, a mounting portion protective member 33, a support protective member 35, and a fall prevention protective member 37.

The cover protective member 31 may be provided to cover an upper end of the display 10. The cover protective member 31 may be provided to receive a portion of the stand 20. The cover protective member 31 may receive the second part 22 of the stand 20. The cover protective member 31 may include a second part receiving member 32 provided to receive the second part 22. The cover protective member 31 may be formed to cover an upper end of the front surface and an upper end of the rear surface of the display 10.

The mounting portion protective member 33 may be provided to cover a portion of the lower end of the display 10. The mounting portion protective member 33 may be provided to cover a portion of the display 10 to which the stand 20 is mounted. The mounting portion protective member 33 may be detachably coupled to a portion of the display 10 to which the stand 20 is mounted. The mounting portion protective member 33 may be formed to cover a portion of the lower end of the rear surface of the display 10. Accordingly, when the mounting portion protective member 33 is separated from the display 10, the mounting portion protective member 33 may be separated from the display 10 without lifting the display 10.

The support protective member 35 may be detachably coupled to a portion of the lower end of the display 10. The support protective member 35 may be disposed on both sides of the mounting portion protective member 33, respectively. The support protective member 35 may be provided to cover a lower edge of the display 10. The support protective member 35 may be provided to receive a portion of the stand 20. The support protective member 35 may receive the first part 21 of the stand 20. The support protective member 35 may include a first part receiving member 34 for receiving the first part 21. The support protective member 35 may be formed to cover a portion of the lower end of the front surface and a portion of the lower end of the rear surface of the display 10.

The support protective member 35 may support the display 10 to prevent the fall of the display 10 when the mounting portion protective member 33 is separated from the display 10. That is, the support protective member 35 may be provided to stably support the display 10 even when the mounting portion protective member 33 is separated from the display 10.

The support protective member 35 may include a support coupler 36 to be coupled to the fall prevention protective member 37. The support coupler 36 may be formed to correspond to a protective member coupler 38 of the fall prevention protective member 37.

That is, in the display apparatus 1 according to one embodiment of the present disclosure, the mounting portion protective member 33 covering a portion of the display 10, to which the stand 20 is mounted, is provided to be separated from the support protective member 35, and thus it is possible to assemble the stand 20 to the display 10 when the display 10 is in an upright state. Accordingly, damage to the display 10 may be prevented by reducing an external force that may be applied to the display 10 when the stand 20 is mounted.

The fall prevention protective member 37 may be coupled to a side end of the display 10 and a side end of the support protective member 35. The fall prevention protective member 37 may be coupled to the display 10 to cover a side edge of the display 10, and to be coupled to the support protective member 35 to expand a length of the display apparatus 1 in the front and rear direction.

The fall prevention protective member 37 may include the protective member coupler 38 formed to be coupled to the side end of the support protective member 35. The protective member coupler 38 may be provided in a groove shape. The protective member coupler 38 may be formed in a shape to which the support coupler 36 of the support protective member 35 is inserted. The fall prevention protective member 37 may be coupled to the outside of the support protective member 35.

The fall prevention protective member 37 may include a display coupler 39 formed to be coupled to the left and right edges of the display 10. The display coupler 39 may be provided to be separated from the protective member coupler 38. The display coupler 39 may be formed on a surface different from one surface of the fall prevention protective member 37 on which the protective member coupler 38 is formed. The display coupler 39 may be formed to correspond to the side edge of the display 10.

The fall prevention protective member 37 may be formed in such a way that a length in the front and rear direction of the fall prevention protective member 37 coupled to the display 10 is approximately the same as a length in the front and rear direction of the support protective member 35 coupled to the display 10.

The fall prevention protective member 37 may be formed in such a way that a length in the front and rear direction of the fall prevention protective member 37 coupled to the support protective member 35 is greater than the length in the front and rear direction of the support protective member 35 coupled to the display 10.

That is, the fall prevention protective member 37 may be coupled to the display 10 and the support protective member 35 to allow a portion, which extends in the vertical direction when coupled to the display 10 to cover the display 10, to extend in the front and rear direction when coupled to the support protective member 35 to prevent the fall of the display 10. The fall prevention protective member 37 may be coupled to the support protective member 35 in a state different from a state of being coupled to the display 10.

With this configuration, when the fall prevention protective member 37 is coupled to the support protective member 35, a length of the lower end of the display apparatus 1 in the front and rear direction may extend in comparison with a case in which the fall prevention protective member 37 is coupled to the display 10. In addition, when the fall prevention protective member 37 is coupled to the support protective member 35, an area of the display apparatus 1 in contact with the floor may increase. The length of the lower end of the display apparatus 1 may extend in the front and rear direction and the area in contact with the floor may increase. Accordingly, when the stand 20 is mounted on the display 10, the fall of the display 10 may prevented and the display 10 may be supported more stably. Particularly, when the display 10 is provided in a size of 75 inches, the fall prevention protective member 37 may prevent the fall of the display 10 even when the display 10 is tilted up to about 20° with respect to the vertical direction.

In addition, when the stand 20 is coupled to the display 10 using the fall prevention protective member 37 covering the display 10, the fall of the display 10 may be prevented, thereby reducing costs.

Further, because the protective member coupler 38 of the fall prevention protective member 37 has a groove shape, and the support coupler 36 has a protrusion shape to be inserted into the protective member coupler 38, an operator can easily assemble the display apparatus 1.

The stand 20 may be received in the protective member 30 before being mounted on the display 10. That is, the stand 20 may be received in the protective member 30 during storage and delivery of the display apparatus 1. Accordingly, the display apparatus 1 according to one embodiment of the present disclosure may be stored and delivered compactly.

Particularly, the first part 21 of the stand 20 may be received in the support protective member 35. The second part 22 of the stand 20 may be received in the cover protective member 31. Alternatively, the second part 22 may be received in the support protective member 35 and the first part 21 may be received in the cover protective member 31. In addition, both the first part 21 and the second part 22 may be received in the cover protective member 31, or both the first part 21 and the second part 22 may be received in the support protective member 35. In addition, the first part 21 and the second part 22 may be received in the mounting portion protective member 33.

When the first part 21 is received in the support protective member 35, at least a portion of the first part 21 may be covered by the fall prevention protective member 37. The first part 21 may be provided to be separated from the support protective member 35 when the fall prevention protective member 37 is separated from the display 10.

A method of assembling the display apparatus 1 according to one embodiment of the present disclosure will be described with reference to FIGS. 3 to 10.

Referring to FIGS. 3 and 10, the display apparatus 1 including the display 10 covered by the protective member 30 for storage and delivery and the stand 20 received in the protective member 30 is provided.

Referring to FIGS. 4 and 10, in order to install the stand 20 to the display 10, the fall prevention protective member 37 is separated from the side edge of the display 10 (101).

The fall prevention protective member 37 separated from the display 10 may be coupled to the support protective member 35 (102). Particularly, the fall prevention protective member 37 may be coupled to the support protective member 35 by inserting the support coupler 36 of the support protective member 35 to the protective member coupler 38 of the fall prevention protective member 37.

Referring to FIGS. 5 and 10, the first part 21 of the stand 20 received in the support protective member 35 and the second part 22 of the stand 20 received in the cover protective member 31 may be separated (103). The first part 21 may be separated from the support protective member 35 through the space in which the fall prevention protective member 37 covers the display 10.

Referring to FIGS. 6 and 10, the stand 20 may be prepared by coupling the first part 21 and the second part 22 separated from the protective member 30 (104).

Particularly, the first part 21 may include a first part coupler 21*a*, and the second part 22 may include a second part coupler 22*a*. As the second part coupler 22*a* is inserted into the first part coupler 21*a*, the second part 22 may be fixed to the first part 21.

The second part 22 may include a display fixer 22*b*.

Referring to FIGS. 7 and 10, the display 10 may include a stand mounting portion 16. The stand mounting portion 16 may be located at the lower end of the rear surface of the display 10. Particularly, the stand mounting portion 16 may be formed in a lower portion of the rear cover 13. The stand mounting portion 16 may include a stand coupler 16*a* for coupling to the stand 20.

The mounting portion protective member 33 may be separated from the display 10 to expose a portion of the display 10, to which the stand 20 is to be mounted, so as to allow the stand 20 to be mounted to the stand mounting portion 16 provided in the display 10 (105).

Because the mounting portion protective member 33 is formed to cover only a part of the lower end of the rear surface of the display 10, the mounting portion protective member 33 may be easily separated from the display 10 without lifting the display 10.

Referring to FIGS. 8 and 10, the assembled stand 20 may be mounted on the stand mounting portion 16 of the display 10 (106). Particularly, as the display fixer 22*b* of the second part 22 is inserted into the stand coupler 16*a*, the stand 20 may be fixed to the display 10.

Referring to FIGS. 9 and 10, the cover protective member 31 and the support protective member 35 may be separated from the display 10 to which the stand 20 is mounted. Particularly, after the cover protective member 31 covering the upper end of the display 10 is separated (107), the display 10 may be withdrawn from the support protective member 35 (108). The display apparatus 1 separated from the support protective member 35 may be moved to and placed in a position desired by a user.

By assembling the display apparatus 1 by the above-mentioned method, the display apparatus 1 according to one embodiment of the present disclosure may mount the stand 20 while the display 10 is upright, and thus the display apparatus 1 may prevent the display 10 from being damaged by an external force.

While the present disclosure has been particularly described with reference to exemplary embodiments, it should be understood by those of skilled in the art that various changes in form and details may be made without departing from the spirit and scope of the present disclosure.

What is claimed is:

1. A display apparatus comprising:

a display including a stand mounting portion;

a protective member coupleable to and decoupleable from the display along an edge of the display so that while the protective member is coupled to the display, the protective member covers at least the edge of the display; and a stand, to support the display, mountable to the stand mounting portion of the display along a front and rear direction of the display, wherein the protective member includes:

a mounting portion protective member coupleable to and decoupleable from at least a portion of the stand mounting portion of the display;

a support protective member coupleable to and decoupleable from a portion of a lower end of the display; and a fall prevention protective member coupleable to and decoupleable from a side end of the display and coupleable to and decoupleable from a side end of the support protective member, wherein the fall prevention protective member extends along a vertical direction while coupled to the side end of the display and extends along the front and rear direction of the display while coupled to the support protective member.

2. The display apparatus of claim 1, wherein the fall prevention protective member includes a protective member coupler couplable to the side end of the support protective member.

3. The display apparatus of claim 2, wherein the fall prevention protective member includes a display coupler, which is formed on a surface of the fall prevention protective member that is separate from a surface of the fall prevention protective member on which the protective member coupler is formed, so that the display coupler is couplable to the side end of the display.

4. The display apparatus of claim 2, wherein the support protective member includes a support coupler formed to be coupled to the protective member coupler.

5. The display apparatus of claim 1, wherein while the fall prevention protective member is coupled to the side end of the support protective member, a length of the fall prevention protective member along the front and rear direction of the display is greater than a length of the support protective member along the front and rear direction of the display.

6. The display apparatus of claim 1, wherein while the fall prevention protective member is coupled to the side end of the display, a length of the fall prevention protective member along the front and rear direction of the display is same as a length of the support protective member along the front and rear direction of the display.

7. The display apparatus of claim 1, wherein while the support protective member is coupled to the portion of the lower end of the display, the support protective member is disposed on both sides of the mounting portion protective member.

8. The display apparatus of claim 1, wherein the protective member is configured to accommodate the stand.

9. The display apparatus of claim 8, wherein the protective member comprises a cover protective member coupleable to an upper end of the display, wherein the stand comprises:

a first part accommodatable in the support protective member of the protective member; and a second part accommodatable in the cover protective member of the protective member.

10. The display apparatus of claim 9, wherein the first part of the stand is separable from the support protective member while the fall prevention protective member is decoupled from the display.

11. The display apparatus of claim 1, wherein the protective member is provided with expandable polystyrene.

12. A method of assembling a display apparatus comprising:

decoupling a fall prevention protective member that is coupleable to and decoupleable from a display of the display apparatus so that while the fall prevention protective member is coupled to the display, the fall prevention protective member covers at least an edge of the display;

coupling the fall prevention protective member to a support protective member provided to support a lower end of the display;

decoupling a mounting portion protective member from the display to expose a portion of the display to which a stand to support the display is to be coupled; and mounting the stand to the display, wherein the fall prevention protective member extends along a vertical direction while coupled to the side end of the display and extends along a front and rear direction of the display while coupled to the support protective member.

13. The method of assembling the display apparatus of claim 12, wherein a cover protective member is provided that is coupleable to an upper end of the display and the method further comprises:

decoupling at least one part of the stand which is accommodated in the support protective member or the cover protective member before mounting the stand to the display.

14. The method of assembling the display apparatus of claim 13, further comprising decoupling the at least one part of the stand which is accommodated in the support protective member after decoupling the fall prevention protective member from the display.

15. The method of assembling the display apparatus of claim 12, further comprising decoupling the display from the support protective member after mounting the stand to the display.

* * * * *